United States Patent [19]

Collins et al.

[11] Patent Number: 5,312,778
[45] Date of Patent: May 17, 1994

[54] METHOD FOR PLASMA PROCESSING USING MAGNETICALLY ENHANCED PLASMA CHEMICAL VAPOR DEPOSITION

[75] Inventors: Kenneth S. Collins, San Jose; Chan-Lon Yang, Los Gatos; John M. White, Hayward, all of Calif.

[73] Assignee: Applied Materials, Inc., Santa Clara, Calif.

[21] Appl. No.: 618,142

[22] Filed: Nov. 23, 1990

Related U.S. Application Data

[63] Continuation-in-part of Ser. No. 559,947, Jul. 31, 1990, abandoned, and a continuation-in-part of Ser. No. 560,530, Jul. 31, 1990, abandoned, each is a continuation-in-part of Ser. No. 416,750, Oct. 3, 1989, abandoned.

[51] Int. Cl.⁵ .................. H01L 21/00; H01L 21/02; H01L 21/302; H01L 21/463
[52] U.S. Cl. .................. 437/225; 437/228; 427/571
[58] Field of Search .................. 437/225, 228, 233; 427/571

[56] References Cited

U.S. PATENT DOCUMENTS

| | | | |
|---|---|---|---|
| 3,860,507 | 1/1975 | Vossen, Jr. | 437/225 |
| 4,369,205 | 1/1983 | Winterling et al. | 427/571 |
| 4,521,286 | 6/1985 | Horwitz | 437/225 |
| 4,526,643 | 7/1985 | Okano et al. | 156/345 |
| 4,572,759 | 2/1986 | Benzing | 156/345 |
| 4,623,417 | 11/1986 | Spencer et al. | 156/345 |
| 4,632,719 | 12/1986 | Chow et al. | 156/345 |
| 4,673,589 | 6/1987 | Standley | 427/41 |
| 4,761,219 | 8/1988 | Sasaki et al. | 204/298 |
| 4,776,918 | 10/1988 | Otsubo et al. | 156/345 |
| 4,808,258 | 2/1989 | Otsubo et al. | 156/643 |
| 4,842,683 | 6/1989 | Cheng et al. | 156/345 |
| 4,874,494 | 10/1989 | Ohmi | 204/192.12 |
| 4,891,095 | 1/1990 | Ishida et al. | 156/643 |
| 5,011,705 | 4/1991 | Tanaka | 427/571 |

FOREIGN PATENT DOCUMENTS

| | | | |
|---|---|---|---|
| 0272142 | 6/1988 | European Pat. Off. | |
| 0326405 | 8/1989 | European Pat. Off. | |
| 0343017 | 11/1989 | European Pat. Off. | |
| 0396919 | 11/1990 | European Pat. Off. | |
| 0421430 | 4/1991 | European Pat. Off. | |
| 0208125 | 12/1982 | Japan | 427/571 |
| 0176224 | 9/1985 | Japan | 427/571 |
| 0026597 | 2/1986 | Japan | 427/571 |
| 0185915 | 7/1989 | Japan | 427/571 |
| 0237117 | 9/1990 | Japan | 427/571 |
| 0146661 | 6/1991 | Japan | 427/571 |

OTHER PUBLICATIONS

Ohmi, From Alchemy To Science: Technological Challenges Sep. 1, 1989.

*Primary Examiner*—Brian E. Hearn
*Assistant Examiner*—B. Everhart
*Attorney, Agent, or Firm*—Noel F. Heal

[57] ABSTRACT

A method for plasma processing characterized by the steps of disposing a wafer proximate to a cathode within a process chamber, releasing a gas into the chamber, applying R.F. power in the VHF/UHF frequency range to the cathode to form a plasma within the chamber, developing a magnetic field within the chamber having flux lines substantially perpendicular to the surface of the wafer, and varying the strength of the magnetic field until a desired cathode sheath voltage is attained. The apparatus includes a chamber, a wafer-supporting cathode disposed within the chamber, a mechanism for introducing gas into the chamber, an R.F. power source coupled to the cathode operating in the frequency from about 50–800 megahertz, an electromagnetic coil disposed around the chamber adapted to develop a magnetic field within the chamber which is substantially perpendicular to the wafer and a variable output power supply coupled to the coil to vary the magnetic field strength and therefore the cathode sheath voltage within the chamber.

15 Claims, 5 Drawing Sheets

METHOD FOR PLASMA PROCESSING USING MAGNETICALLY ENHANCED PLASMA CHEMICAL VAPOR DEPOSITION

CROSS-REFERENCE TO RELATED APPLICATIONS

This application is a continuation-in-part of two U.S. patent application Ser. Nos. 07/559,947 now abandoned and 07/560,530 now abandoned, both of which were filed on Jul. 31, 1990 and assigned to the assignee of the present invention and both of which are continuations-in-part of U.S. patent application Ser. No. 07/416,750 filed Oct. 3, 1989 now abandoned and assigned to the assignee of the present invention.

BACKGROUND OF THE INVENTION

This invention relates generally to the plasma processing of semiconductor wafers and more particularly to methods and apparatus for plasma processing semiconductor wafers in a reactive ion etch mode.

Integrated circuits (ICs) are fabricated on semiconductor wafers by subjecting the wafers to a precise sequence of processes. These processes can include, but are not limited to, epitaxial deposition, lithographic patterning, chemical vapor deposition, sputter deposition, ion implantation and etch processes.

There is a seemingly inexorable trend in the IC industry to produce more powerful integrated circuits by packing ever greater numbers of active and passive devices into each integrated circuit. This is typically accomplished by both reducing the sizes of the devices within an IC and by arranging the devices more closely together.

As IC devices become smaller and more densely packed they also become more susceptible to damage during the aforementioned processing steps. For example, when the minimum feature size (such as a line width) of an IC reaches about 1 micron, the devices of the integrated circuit may be susceptible to damage if exposed to voltage levels over 200 volts. Since it is not unusual for conventional semiconductor processing equipment, such as a reactive ion etch (RIE) system, to develop considerable voltage levels during operation, steps must be taken to prevent damage to the devices of the integrated circuits.

In a reactive ion etch system a process gas is released into a process chamber and a radio-frequency (RF) power source is coupled to a cathode located within the chamber to create a plasma from the process gas. A semiconductor wafer can be supported by the cathode and positive ions formed within the plasma can be accelerated to the surface of the wafer to provide a very anisotropic etch of the wafer's surface. Conventional RIE systems have been operated at a number of frequencies including a low frequency range from about 10–400 kilohertz and a high frequency range from about 13–40 megahertz.

Both ions and electrons within a plasma are accelerated in systems operated in the low frequency range of 10–400 kilohertz creating the risk of potential damage to IC devices caused by the impact of heavy, high-energy ions against the surface of the wafer. In high frequency operation in the 13–40 megahertz range a steady state cathode sheath is formed near the cathode which typically develops a magnitude of over 1000 volts at 1 kilowatt of power. As mentioned previously, voltages of this magnitude can be very damaging to high-density IC circuitry. In contrast, systems operated in the microwave range of about 900 megahertz to 2.5 gigahertz, such as electron cyclotron resonance (ECR) systems, have sheath voltages so low that an auxiliary bias on the cathode is often required to provide commercially useful etch rates.

Of the frequency range choices, the high frequency range of 13–40 megahertz is most often employed in plasma etch systems. By far the most popular choice for an RIE system operating frequency is the ISM (industry, scientific, medical) standard frequency of 13.56 megahertz. However, the potentially damaging sheath voltages of such systems limits their usefulness in performing certain sensitive etch processes, such as a polysilicon over silicon dioxide ("oxide") etch.

The cathode sheath voltage can be reduced by the use of magnetic confinement techniques such as those disclosed in U.S. Pat. No. 4,842,683 entitled "Magnetic Field-Enhanced Plasma Etch Reactor" of Cheng et al. which teaches the use of a rotating magnetic field above the surface of a wafer having magnetic flux lines substantially parallel to the wafer surface. The magnetic field of Cheng et al. decreases the cathode sheath voltage 25–30 percent, i.e. to about 700 volts, while it increases the etch rate by as much as 50 percent.

A problem with a magnetic enhancement system as disclosed by Cheng et al. is that the electric (E) field created within the cathode sheath is substantially perpendicular to the wafer surface and is therefore at substantially perpendicular to the applied magnetic (B) field. The E×B force created by the interaction of these two fields causes the well-known electron/ion drift effect, which is a major source of etch non-uniformity in magnetically enhanced RIE systems. The aforementioned rotation of the magnetic field reduces, but does not eliminate, etch non-uniformity by averaging the effects of the electron/ion drift over the surface of the wafer.

Another problem encountered with the system of Cheng et al. is that, even with magnetic confinement, a cathode sheath voltage at about 700 volts is still too large to avoid damaging IC devices during certain types of processes. Unfortunately, since the electron/ion drift is caused by the E×B force, raising B to lower the cathode sheath voltage will increase the electron/ion drift effect a corresponding amount. In consequence, the system of Cheng et al. cannot reduce the cathode sheath voltage much below 700 volts by further increasing the B field strength without causing an unacceptably high etch non-uniformity over the surface of the wafer.

One approach to reducing the cathode sheath voltage to acceptably low levels is disclosed in parent application U.S. Ser. No. 07/559,947, filed Jul. 31, 1990, of Collins et al. and entitled "VHF/UHF Reactor System", the disclosure of which is incorporated herein by reference. It is known that the cathode sheath voltage is a function of the RF impedance ($Z_{RF}$) of the plasma which is given by the following relationship:

$$Z_{RF} = R - jx$$

where R is the resistive component of the plasma impedance and x is the reactive component of the plasma impedance. Therefore, an increase in RF frequency causes a decrease in $Z_{RF}$ and a consequent reduction in the cathode sheath voltage. Collins et al. teach that operating a RIE system at VHF/UHF frequencies from about 50 megahertz to about 800 megahertz will result in lower cathode sheath voltages resulting in a softer, less damaging etch processes.

While the system of Collins et al. performs very well, it suffers from the drawback that it requires a variable frequency R.F. power supply or multiple frequency R.F. sources which, for the required power and frequencies, are very large and very expensive. Also, their impedance matching network was, to some extent, a compromise over the range of operating frequencies, resulting in less than optimal impedance matching at any one frequency within the range.

In consequence, there was heretobefore an unsatisfied need for a plasma processing system in which the cathode sheath voltage could be controlled both inexpensively and effectively.

SUMMARY OF THE INVENTION

The method of the present invention couples radio-frequency (RF) energy into a process gas by means of a cathode to form a plasma, develops a magnetic field within the plasma and varies the strength of the magnetic field to vary the cathode sheath voltage. The magnetic field strength and the cathode sheath voltage are inversely related over a selected operating range of the system. Preferably, the flux lines of the magnetic field (B) are parallel to the electric field lines (E) of the cathode sheath to eliminate E×B electron/ion drift.

The preferred frequency of operation is in the VHF/UHF radio frequency band of approximately 50–800 megahertz. Within this range, the relationship between the cathode sheath voltage and the magnetic field allow the cathode sheath voltage to be reduced 75% or more from its maximum value, which does not appear to be possible at lower operating frequencies for RIE systems. Preferably, an RF frequency is chosen which, in the absence of a magnetic field, produces a cathode sheath voltage greater than or equal to the maximum value of the different sheath voltages which may be desired to perform different processes. Processes requiring cathode sheath voltages lower than this maximum value can be obtained by increasing the magnetic field strength.

The apparatus of the present invention includes a process chamber, a wafer-supporting cathode disposed within the process chamber, a mechanism for releasing a process gas within the chamber, a RF power supply operating in the 50–800 megahertz range coupled to the cathode, and a magnet adapted to develop a magnetic field in the chamber which has flux lines substantially perpendicular to the cathode surface. Preferably, a pair of coils coupled to a variable power supply are used to provide a variable magnetic field within the process chamber.

The choice of operating frequencies is an important aspect of the present invention. By operating the system at frequencies within the range of 50–800 megahertz a strong resonance phenomenon is observed which permits the cathode sheath voltage to be varied over a much greater range than if the system was operated at lower frequencies.

An advantage of this invention is that the cathode sheath voltage can be controlled with a relatively inexpensive D.C. constant current source instead of the relatively expensive R.F. power source as disclosed by Collins et al. Alternatively, replaceable permanent magnets can be used to vary the B field strength within the process chamber.

By applying a B field which is substantially parallel to the E field of the cathode sheath, the effects of electron-/ion drift are minimized. A vertical B field furthermore reduces radial diffusion losses of the free electrons, thereby increasing plasma density and etch rate.

These and other advantages of the present invention will become clear to those skilled in the art upon a study of the detailed description of the invention and of the several figures of the drawings.

BRIEF DESCRIPTION OF THE DRAWINGS

FIG. 2b is a front elevational view of a first vertical magnetic field coil pair configuration as seen along line 2—2 of FIG. 2a;

FIG. 2c is a front elevational view of a second vertical magnetic field coil pair configuration as seen along line 2—2 of FIG. 2a;

FIG. 2d is a front elevational view of a single vertical magnetic field coil configuration as seen along line 2—2 of FIG. 2a;

DETAILED DESCRIPTION OF THE PREFERRED EMBODIMENTS

Figure 1:
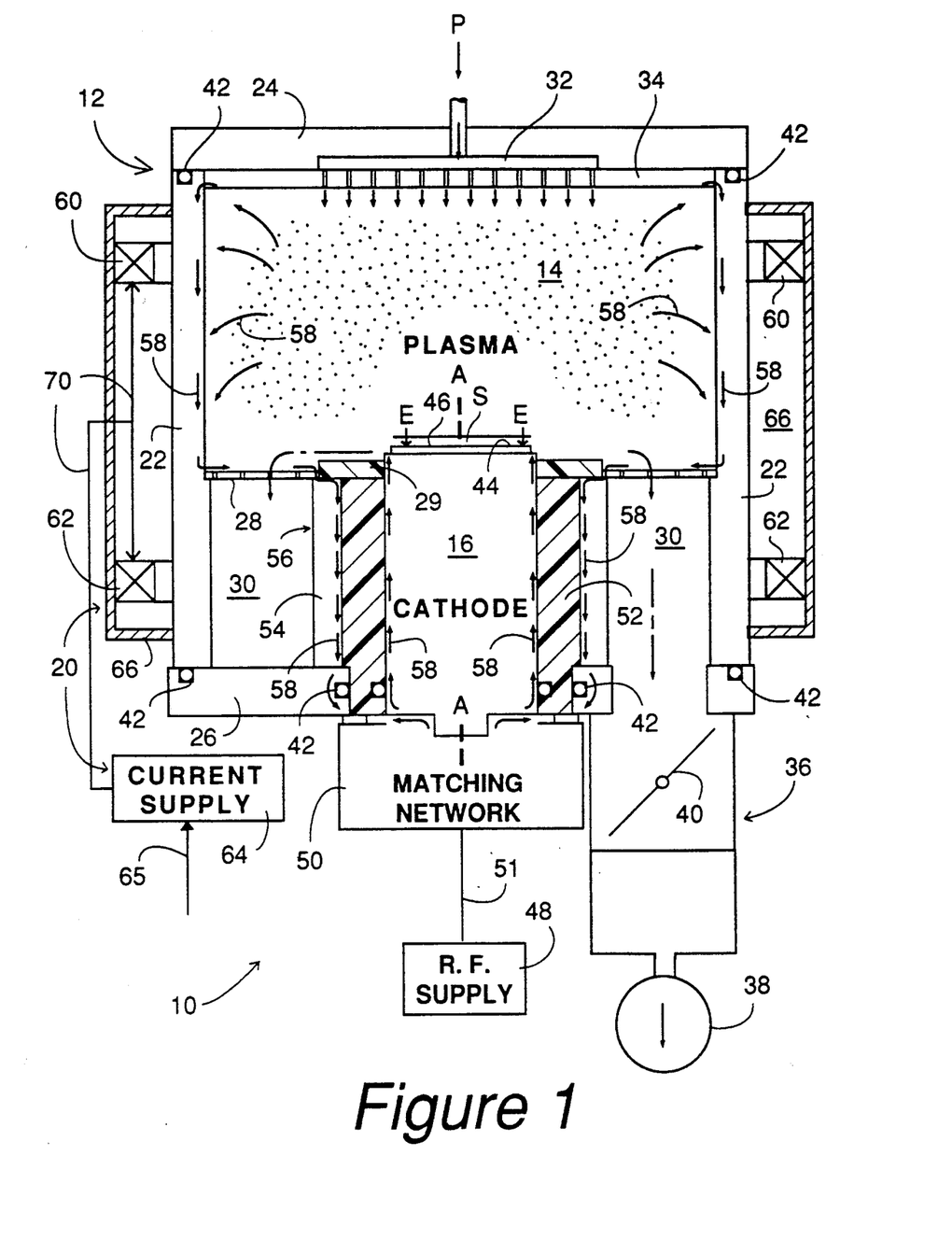
FIG. 1 is a cross-sectional view of a plasma processing apparatus in accordance with the present invention.

In FIG. 1, a plasma processing apparatus 10 in accordance with the present invention includes an enclosure 12 defining a processing chamber 14, a cathode 16, a radio-frequency (R.F.) supply system 18 coupled to the cathode 16, and a magnetic enhancement system 20 for providing a magnetic field within chamber 14. As will be explained in more detail subsequently, the plasma processing apparatus 10 typically operates in the well-known reactive ion etch (R.I.E.) mode wherein positive ions of a process gas are accelerated to the surface of a wafer to provide a highly anisotropic etch of the surface.

Enclosure 12 includes sidewalls 22, lid 24 and base 26. An apertured plate 28 divides the process chamber 14 from an exhaust manifold 30 within the enclosure 12 and an insulating ring 29 insulates the plate 28 from the cathode 16. A process gas P is released into an inlet manifold 32 and is dispersed through an apertured plate or showerhead 34 into the process chamber 14. Gasses, ions, particulates and other matter can be exhausted from the chamber 14 through the exhaust manifold 30 an out an exhaust conduit 36 by means of a pump 38. A throttle valve 40 can be used to regulate the flow rate of the exhaust through the exhaust conduit 36.

The portions of enclosure 12 which are exposed to the process chamber 14 should be made from process-compatible materials. For example, the sidewalls 22, plate 28 and showerhead 34 are preferably made from anodized aluminum. The vacuum integrity of the enclosure 12 is ensured by a number of seals 42 between abutting surfaces of the sidewalls, lid, base, etc.

The cathode 16 is an elongated, conductive member having an upper surface 44 which can be exposed to the process chamber 14. It is therefore important that at least the upper surface 44 of the cathode 16 be made from a process compatible material, such as the aforementioned anodized aluminum. A semiconductor wafer 46 can be supported by the upper surface 44 of the cathode 16 for subsequent processing.

The R.F. supply system 18 includes an R.F. power supply 48 coupled to a matching network 50 which matches the impedance of the power supply 48 to the impedance of the rest of the plasma processing apparatus 10. Typically, a coaxial transmission line 51 having a characteristic impedance substantially the same as the output impedance of the power supply 48 is used to couple the R.F. power supply 48 to the matching network 50. The cathode 16 cooperates with an insulating sleeve 52 and a conductive sleeve 54 to serve as a coaxial transmission line 56 which couples the matching network to the process chamber 14. The sleeve 54 is electrically coupled to the base 26 and the plate 28. The sidewalls 22 are electrically coupled to the lid 24, showerhead 34, plate 28 and the base 26. When R.F. power is applied to cathode 16 the process gas P within process chamber 14 is ionized to form a plasma due to the acceleration of free electrons which undergo collisions with the gas molecules to create positive ions of the gas molecules and more free electrons. The cathode sheath S above the cathode 16 creates an electric field E which is substantially perpendicular to the cathode surface. A current flows along a current path 58 comprising the cathode 16, the plasma within process chamber 14, showerhead 34, sidewalls 22, plate 28 and conductive sleeve 54.

Magnetic enhancement system 20 preferably includes a pair of electromagnetic coils 60 and 62 and a D.C. power supply 64. As will be discussed in greater detail subsequently, the coils 60 and 62 develop a magnetic field within process chamber 14 to confine more free electrons above the cathode 16 thereby reducing the D.C. bias voltage on the cathode. The coils 60 and 62 of this preferred embodiment are approximately 17 inches in diameter and comprise 180 turns of #12 square magnet wire forming a toroid having cross-sectional dimensions of about 1.5 inches in height and 1 inch in width and an unshielded inductance of approximately 19-20 millihenrys each. Preferably, the coils are covered with a magnetic shield 66 made from a high magnetic permeability material such as soft iron or carbon steel to minimize magnetic coupling and interference with nearby equipment and to shield the process chamber from external magnetic influences. When the coils 60 and 62 are covered with the shield 66, the inductance of each coil drops to about 14 millihenrys.

The D.C. power supply 64 is preferably a variable, current regulated supply capable of supplying currents in the range of 0 to about 20 amperes. A suitable D.C. power supply is commercially available from the Sorensen Company of Chicago, Ill. as product DCS 40-25. In can be controlled by an input 65 which can be a manual input from a knob or a signal input from a control device such as a computer.

Figure 2A:
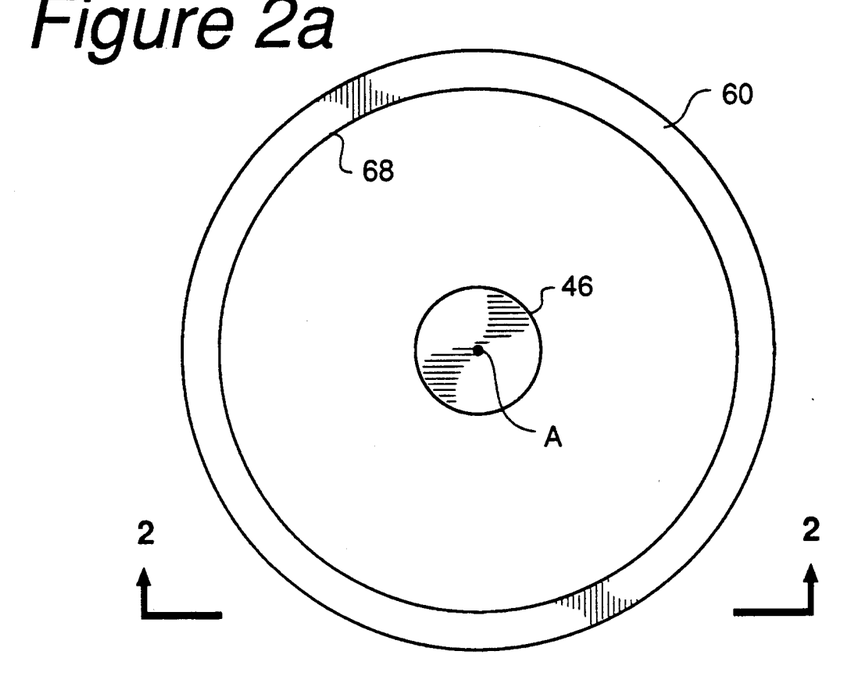
FIG. 2a is a top plan view illustrating an orientation of an electromagnetic coil and a wafer of the plasma processing apparatus of FIG. 1.
Figure 2B:
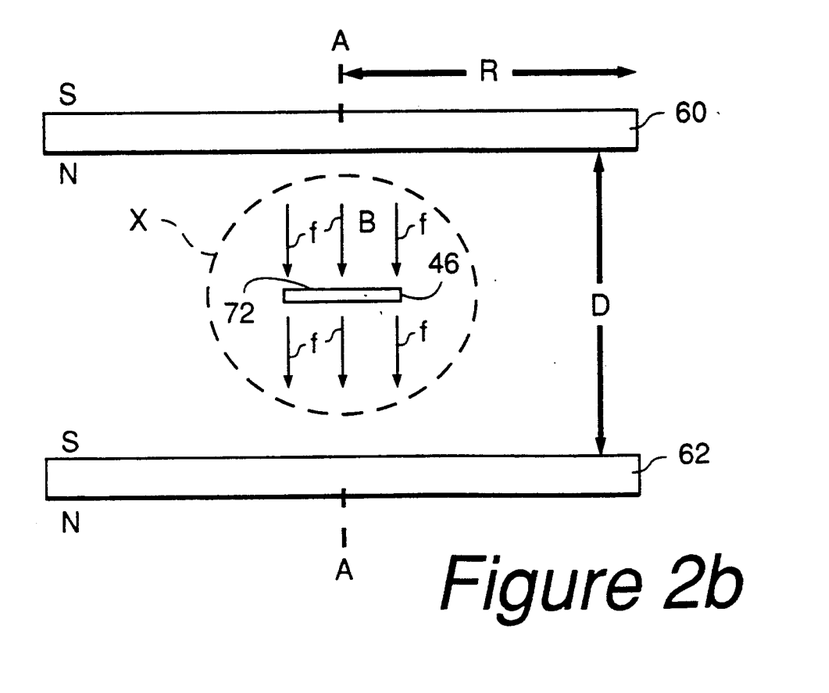

A preferred method for operating the magnetic enhancement system 20 will be discussed with reference to FIGS. 1, 2a and 2b. In the top plan view of FIG. 2a, the top of wafer 46 (which is resting on upper surface 44 of cathode 16) can be seen through the inner circumference 68 of coil 60. Current is supplied to coils 60 and 62 by the D.C. power supply 64 by power lines 70. In this preferred embodiment, the magnetic fields developed by coils 60 and 62 aid each other, i.e. dissimilar magnetic poles of the two coils face each other. This can be seen in FIG. 2b where the north pole of coil 60 faces the south pole of coil 62 thereby developing a magnetic field B which is substantially perpendicular to the upper surface 72 of the wafer 46. In this preferred embodiment, the coils 60 and 62 share a common magnetic axis A which coincides with an axis of symmetry A of both the wafer 46 and the cathode 16. It should be noted that the magnetic polarities of the coils 60 and 62 can be reversed, i.e. the B field can be pointing upwardly in FIG. 2b, without noticeable effect on the process.

Preferably, the coils 60 and 62 are arranged in a Helmholtz configuration where the distance D between the coils is approximately equal to the radius R of each of the coils. The Helmholtz configuration results in a region X between the two coils where the magnetic flux lines f of the B field are substantially parallel to each other and substantially normal to the planes of the two coils. It is important that the B field be uniform in the proximity of the wafer 46 to provide etch uniformity over the surface of the wafer.

Figure 2C:
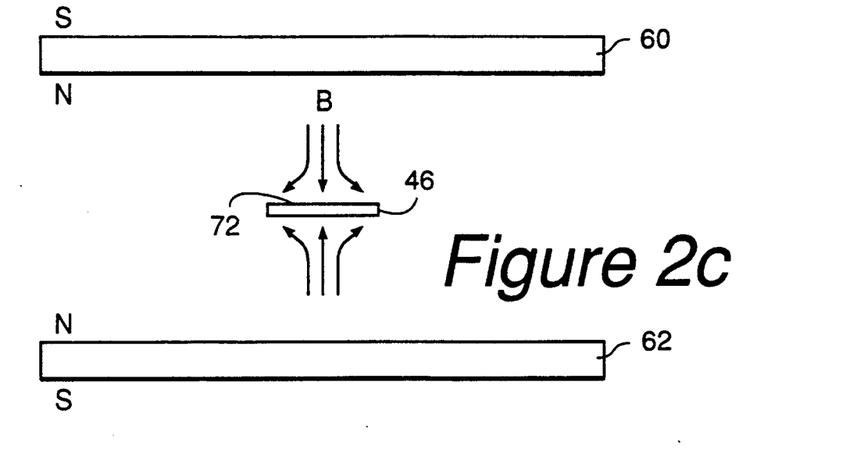

An alternative method for operating the magnetic enhancement system 20 of FIG. 1 is illustrated in FIG. 2c. In this embodiment, the magnetic fields produced by coils 60 and 62 oppose each other, i.e. the north poles of the two coils face each other. This creates a magnetic mirror within the process chamber proximate the wafer 46. While the magnetic mirror is advantageous in that it enhances the concentration of energetic electrons near the surface 72 of the wafer, it increasingly suffers from the electron/ion drift effect away from the center of the wafer. A description of a method and apparatus for the magnetic enhancement of a plasma etching system is found in co-pending U.S. patent application Ser. No. 07/349,010, filed May 8, 1989, of Hanley et al. entitled "Magnetically Enhanced Plasma Reactor System for Semiconductor Processing (as amended)" and assigned to the assignee of this application, the disclosure of which is hereby incorporated herein by reference.

Figure 2D:
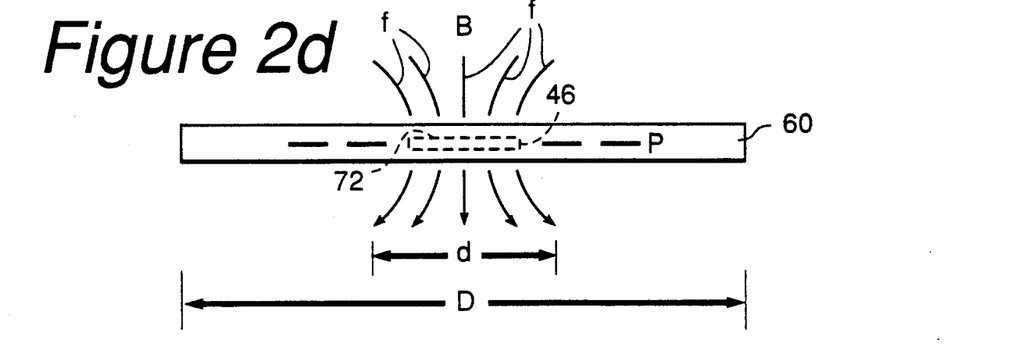

Another alternative method for operating a magnetic enhancement system for a plasma processing system is illustrated in FIG. 2d wherein only a single coil 60 lying in a plane P of the wafer 46 is used to create the magnetic field B. If the coil 60 diameter D is large compared to the wafer diameter d a magnetic field B is created proximate the center of coil 60 having flux lines f which are substantially parallel and perpendicular to the wafer surface 72 of the wafer 46. A drawback of this single coil arrangement is that unless D is much greater than d, e.g. at least four times as large, and unless the anode surface is very close to the cathode that the B field will be insufficiently uniform to provide good etch uniformity. Therefore, the single coil configuration of FIG. 2d is best adapted for standalone single wafer etch systems where the size of the coil 60 is less important than in multi-chamber etch systems.

As can be seen above, there are a great number of ways that the variable magnetic enhancement system of the present invention can be implemented. For example, on plasma etch system chambers which are not cylindrical the coils can be made to follow the external contours of the chamber. Since an Applied Materials Precision Etch 5000 has octagonal chamber shapes, electromagnetic coils can be made in a matching octagonal shape to closely engage the outer surface of the chamber. When placing such coils in a Helmholtz configuration, the distance between opposite faces of the octagonally shaped coils are used as the coil radius R.

It should further be noted that it is possible to replace one or more of the electromagnetic coils of the magnetic enhancement system with permanent magnets. For example, one or both of the magnetic coils 60 and 62 of FIG. 2b can be replaced or aided with one or more permanent magnets as taught in the Hanley et al. patent, supra, the disclosure of which has been incorporated by reference. The strength of the magnetic field in permanent magnet embodiments of the present invention can be changed by physically changing the permanent magnets in the apparatus 10 as part of a process kit. For example, in Hanley et al., the permanent magnet 246 within cathode 216 could be replaced with another permanent magnet having greater or lesser magnetic field strength. Another potential location for a permanent magnet is within a suitable enlarged inlet manifold 32, where the magnet would be positioned so as not to prevent the process gas P from flowing into the chamber 14. A process kit for forming windows in silicon dioxide layers can use weak permanent magnets to create a high sheath voltage while a process kit for etching polysilicon can have strong permanent magnets to create a low sheath voltage. Specific processes in accordance with the present invention will be discussed in greater detail subsequently.

Figure 3:
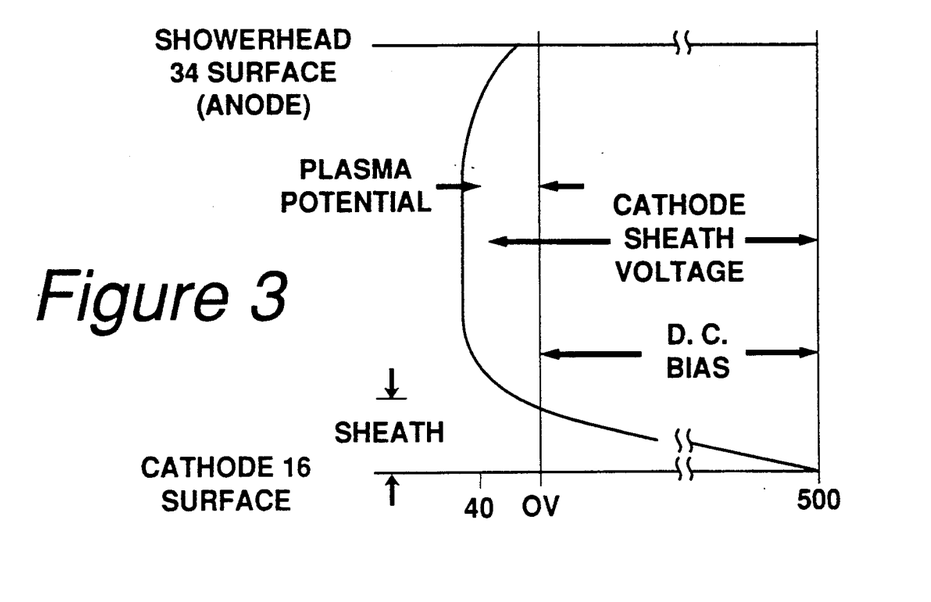
FIG. 3 is a graph illustrating the D.C. bias of the apparatus of FIG. 1.

In FIG. 3 is a graph illustrating the various D.C. potentials within chamber 14 of apparatus 10 with no magnetic field, i.e. with 0 amperes applied to the coils 60 and 62. At the inner surface of showerhead 34, which serves here as an anode, the voltage is zero. Within the body of the plasma within chamber 14 the plasma potential is typically in the range of +20 to +40 volts. The sheath layer near the surface of cathode 16 is strongly negative, often obtaining a cathode sheath voltage of 500 volts. The difference between the plasma potential and the cathode sheath voltage (i.e. plasma potential minus the cathode sheath voltage) is the D.C. bias within the process chamber 13. As can be seen, in RIE systems the cathode sheath voltage is very nearly the same as the D.C. bias. As will be discussed subsequently with reference to FIG. 4, the magnetic enhancement of the present invention reduces the cathode sheath voltage level and, in consequence, the D.C. bias on the cathode.

Figure 4:
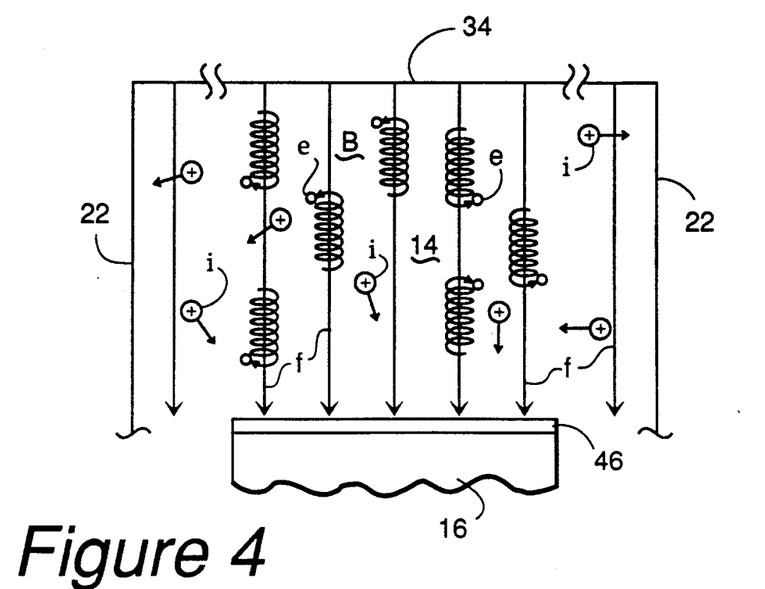
FIG. 4 is a diagram illustrating the magnetic flux lines of the apparatus of FIG. 1.

FIG. 4 illustrates the magnetic field B developed by the magnetic enhancement system 20 of FIG. 1. The effect of the magnetic field B is to cause free electrons e to spiral along the flux lines f of the B field. The electrons e can equally well move up or down the flux lines but are constrained from crossing the flux lines f. The much heavier positive ions i, however, are essentially free to move around the process chamber 14 and to cross the flux lines f. The ions i can therefore impact upon the sidewalls 22 of the apparatus while the electrons e are constrained to impacting upon the showerhead 34 and wafer 46 if they are sufficiently energetic.

As noted previously, the cathode sheath voltage decreases with decreasing R.F. impedance of the plasma. It was also noted that the cathode sheath voltage is inversely related to the strength of the magnetic field B within an operating range to be discussed subsequently. This is because R.F. impedance $Z_{RF}$ of a plasma is inversely related to the strength of the B field within the operating range.

Briefly, $Z_{RF}$ is directly to the density of the electrons and the ions within the plasma. Since the electrons are constrained to move along the magnetic flux line f, fewer electrons will be lost to the sidewalls 22, creating a greater density of electrons in the plasma. While the ions are not similarly constrained, the higher density of electrons will also produce a higher density of ions due to more frequent electron/gas molecule collisions. In consequence, the B field increases electron and ion density in the plasma, which decreases $Z_{RF}$ which, in turn, decreases the cathode sheath voltage.

The reason why a stronger magnetic field reduces $Z_{RF}$ more than a weaker magnetic field has to do with the average radius of the spiraling electrons and with the mean free path between particles within the plasma. The radius of gyration of an electron around a magnetic flux line is given, in meters, by the Lamor radius $R_L$:

$$R_L = (mv)/qB$$

where m is the mass of the electron in kilograms, v is its initial velocity in meters/second, q is the charge of the electron in coulombs, and B is the magnitude of the magnetic flux density in tesla. In consequence, the average radius of the electrons spiraling along the magnetic flux lines f is inversely proportional to the strength of the B field. If the mean free path (MFP) between particles is much greater than the radius $R_L$ there will be few collisions between the spiralling electrons and the particles within the plasma. Fewer collisions mean that fewer electrons will be knocked off of their spiralling paths along the magnetic flux lines to be lost, such as to the chamber walls. Therefore, an increase in B field strength will increase the electron and ion density within the plasma and result in the desired reduction of $Z_{RF}$ and electrode sheath voltage.

If the Lamor radius $R_L >>$ MFP commercially practical B fields will have little or no effect on electron confinement due to frequent collisions between the electrons and other particles within the plasma. The present invention, therefore, preferably operates in the relatively low RIE pressure ranges of less that 500 millitorr and most preferably in the tens of millitorr or below.

Figure 5:
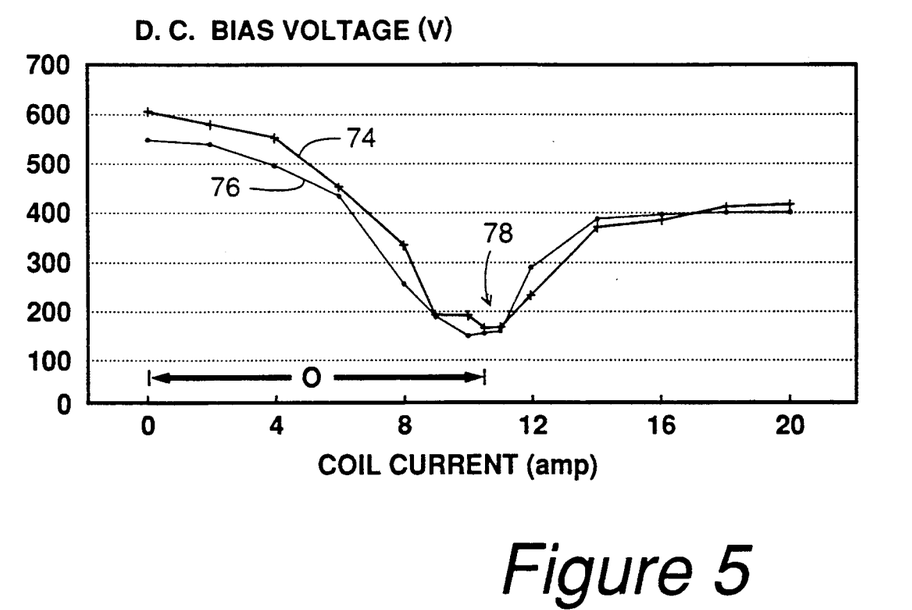
FIG. 5 is a graph illustrating the relationship between coil current and D.C. bias voltage on the cathode of the apparatus of FIG. 1.

FIG. 5 illustrates the relationship between the D.C. bias voltage on the cathode 16 versus the coil current through the coils 60 and 62 of the apparatus of FIG. 1 when it is operated at 1 kilowatt of R.F. power. A first curve 74 illustrates the relationship at 20 millitorr and the second curve 76 illustrates the relationship at 30 millitorr. It can be seen that within an operating range O that the D.C. bias voltage is inversely related to the coil current. Since the coil current is directly related to the magnetic field B produced by the coils, there is a clear inverse relationship between the D.C. cathode bias and the strength of the magnetic field within the operating range O.

An important phenomenon occurs when operating the apparatus 10 of the present invention in the VHF/UHF range of about 50-800 megahertz. As seen in FIG. 5, a large dip 78 occurs in the curves 74 and 76 when approximately 7-14 amperes are applied to the coils 60 and 62. It is believed that the dip 78 is due to a resonance phenomenon between the magnetic field and the oscillating electrons. This dip is pronounced in the frequency operating ranges from 50-800 megahertz but is not evident at frequencies below about 40 megahertz. This resonance is important to the present invention in that it considerably extends the range of available D.C. biases. For example, the curve 74 shows that the D.C. bias can be adjusted from about 600 volts to about 150 volts, a 75% reduction, by varying the coil current from 0 amperes to about 11 amperes. Currents outside of the operating range O can be used for magnetic confinement, but D.C. bias starts increasing with increasing current above about 11 amperes.

The apparatus 10 of the present invention is applicable to a great number of processes due to the ability to control the D.C. bias of the cathode by varying the magnetic field within the process chamber. It can also be used to practice the processes of parent application U.S. Ser. No. 07/560,530, filed Jul. 31, 1990, of Collins et al., entitled "VHF/UHF Plasma Process for Use in Forming Integrated Circuit Structures on Semiconductor Wafers", the disclosure of which is hereby incorporated by reference, by providing a variable or multiple frequency R.F. supply 48. Several exemplary examples of processes in accordance with the present invention are given below.

PROCESS EXAMPLE NO. 1—CONTACT WINDOWS

A relatively high D.C. bias on cathode 16 is desired when etching contact windows through a silicon dioxide ($SiO_2$) layer to an underlying polysilicon layer. Such a step requires a high etch rate selectivity and fairly good vertical ansiotropy for the window sidewalls. Typical process parameters are as follows:

R.F. power = >1 kilowatt
R.F. frequency = >90 megahertz
Process gas = >$CHF_3$ @ 50 sccm and Ar @ 120 sccm
Chamber Pressure = >30 millitorr.

The D.C. coil current is set in the range of 0–7 amperes to set the D.C. bias on the cathode to between 500 volts D.C. and 350 volts D.C. The actual, desired D.C. bias is dependent upon the desired characteristics of the device being etched. For example, a higher D.C. bias will have greater selectivity but may result in increased damage to the polysilicon layer. On at typical 5 or 6 inch wafer being etched in an Applied Materials Precision 5000 Etch chamber, the process parameters set out above will result in an etch rate of 6000–7000 A/minute.

PROCESS EXAMPLE NO. 2—VIA HOLES

A more intermediate D.C. bias on cathode 16 is desired when forming vias in silicon dioxide to connect to an underlying metal layer such as aluminum. This is because aluminum is very easily sputtered when bombarded by high energy ions which can cause redeposition on the via hole sidewalls and on the wafer surface. It is therefore desirable to keep the cathode D.C. bias to about 200 volts when forming via holes through silicon dioxide to aluminum. Typical process parameters are:

R.F. power = >1 kilowatt
R.F. frequency = >90 megahertz
Process gas = >$CHF_3$ @ 25 sccm, $CF_4$ @ 25 sccm, and Ar @ 120 sccm
Chamber Pressure = >30 millitorr.

The D.C. coil current is set to about 8–9 amperes to set the D.C. bias of the cathode to about −200 volts D.C. On at typical 5 or 6 inch wafer being etched in an Applied Materials Precision 5000 Etch chamber, the process parameters set out above will result in an etch rate of 5000–6000 A/minute.

PROCESS EXAMPLE NO. 3—POLYSILICON ETCH

A relatively low D.C. bias on cathode 16 is desired when etching polysilicon over silicon dioxide. As mentioned previously, polysilicon is sensitive to bombardment by energetic ions and, therefore, a soft process is desirable. Also, since silicon dioxide does not appreciably etch at low ion energies very good etch selectivity is possible at these lower energies. Typical process parameters are:

R.F. power = >0.4 kilowatt
R.F. frequency = >90 megahertz
Process gas = >$Cl_2$ @ 80 sccm, He @ 100 sccm, and $O_2$ @ 0–4 sccm
Chamber Pressure = >30 millitorr.

The coil current is adjusted to approximately 10–11 amperes to develop a D.C. bias of 50–75 volts D.C. on the cathode, which will result in an etch rate of 3500–4500 A/minute. At this power level, the etch mechanism includes both low energy ions and radicals.

A method for forming a plasma in accordance with a preferred embodiment of the present invention will be discussed with reference to FIG. 6. In a first step 80 a processing gas, such as one of the processing gasses described above, is provided into a process chamber. In a second step 82, R.F. power is coupled into the gas with a cathode to form a plasma from the process gas and a sheath near the cathode. In a step 84, a magnetic field is created within the plasma, and in a step 86 the strength of the magnetic field is varied to vary the potential of the sheath. Preferably, the gas is provided at pressures less than about 500 millitorr, and the frequency of the R.F. power is in the range of about 50–800 megahertz. The magnetic field can be produced by permanent magnets or electromagnets.

Figure 6:
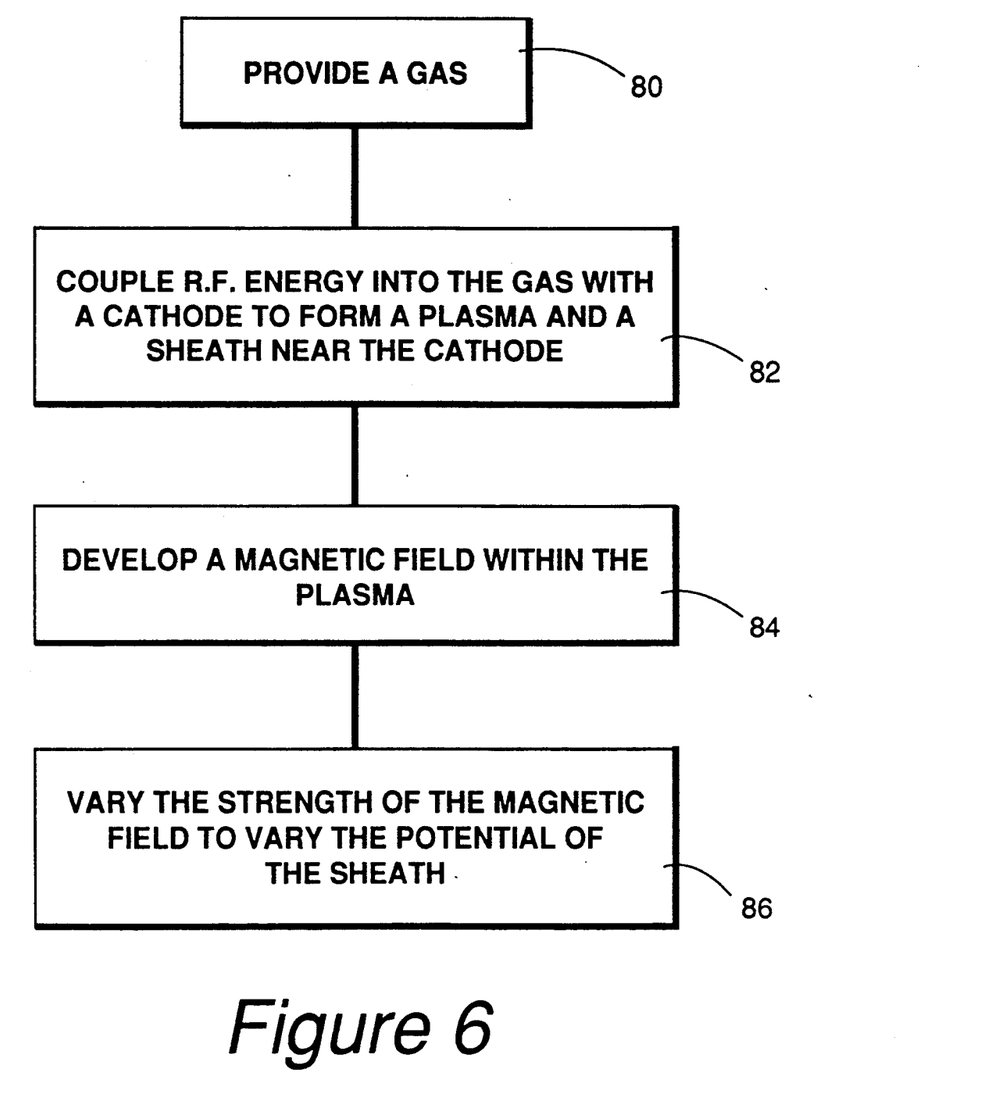
FIG. 6 is a flow chart of a method for forming a plasma in accordance with the present invention.

It is important to note that the process steps are not necessarily performed in the order shown in FIG. 6. For example, the step 84 of developing the magnetic field can precede the step 82 of coupling R.F. energy into the gas. As such, the order of the steps taught in the above process examples are by way of example only and are not to be construed as limitations on the scope of the present invention.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. A method for forming a plasma comprising:
   providing a gas;
   coupling radio frequency energy into said gas through a cathode to form a plasma having a substantially electrically neutral body portion comprising positive ions of said gas and free electrons, said plasma further having an electron-depleted sheath portion proximate to said cathode, said sheath portion having an electrical potential;
   developing a magnetic field within said plasma, wherein the cathode has a surface for supporting a workpiece adjacent to the sheath portion of the plasma, and wherein flux lines of the magnetic field proximate to the surface of the cathode are substantially perpendicular to at least a portion of the surface of the cathode; and varying the strength of said magnetic field to vary the electric potential of said sheath portion, where said electric potential is inversely related to said strength of said magnetic field within a desired operating range.

2. A method for forming a plasma as recited in claim 1 wherein said radio frequency energy has a frequency in the range of 50 megahertz to 800 megahertz.

3. A method for developing a range of cathode sheath voltages in a plasma processing machine comprising:
   determining a cathode sheath voltage upper limit for a plasma processing machine;
   releasing a process gas proximate a cathode of said plasma processing machine, said cathode being provided with a surface adapted to support a wafer and having an axis which is substantially normal to at least a portion of said surface;
   applying radio-frequency power to said cathode to form a plasma from said gas and to develop a cathode sheath proximate said surface of said cathode, where said radio-frequency is chosen such that cathode sheath voltage is no higher than said upper limit;
   developing a magnetic field within said plasma having flux lines which are substantially parallel to said axis of said cathode proximate to said surface of said cathode; and
   varying the strength of said magnetic field to vary said cathode sheath voltage from a maximum no greater than said upper limit when said magnetic field strength is at a minimum to a cathode sheath voltage lower limit when said magnetic field strength is at a maximum.

4. A method as recited in claim 3 wherein said radio-frequency is a fixed frequency within the range of 50 megahertz to 800 megahertz.

5. A method as recited in claim 4 wherein said upper limit is about 500 volts and said lower limit is about 50 volts.

6. A method for plasma processing a wafer within a chamber comprising:
   disposing a wafer proximate to a cathode within a processing chamber;
   releasing a process gas into said chamber;
   applying radio frequency power having a frequency in the range from about 50 megahertz to about 800 megahertz to said cathode sufficient to create a plasma within said chamber and to develop a cathode sheath proximate to said cathode;
   developing a magnetic field within said chamber having flux lines which are substantially perpendicular to a surface of said wafer; and
   varying the strength of said magnetic field until a desired cathode sheath voltage level is attained.

7. A method as recited in claim 6 wherein said processing gas is an etchant gas at a pressure less than about 500 millitorr.

8. A method as recited in 6 wherein said magnetic field is developed by electromagnetic coil means.

9. A method as recited in claim 8 wherein said electromagnetic coil means includes a pair of coils having a common magnetic axis.

10. A method as recited in claim 9 wherein said pair of electromagnetic coils develop magnetic fields which are of opposing polarities.

11. A method as recited in claim 9 wherein said pair of electromagnetic coils develop magnetic fields of the aiding polarities.

12. A method as recited in claim 9 wherein said pair of coils are arranged in a Helmholtz configuration.

13. A method as recited in claim 8 wherein said strength of said magnetic field is varied by varying an electric current supplied to said electromagnetic coil means.

14. A method as recited in claim 7 wherein said magnetic field is developed, at least in part, by permanent magnet means.

15. A method as recited in claim 14 wherein said at least a portion of said permanent magnet means is replaceable in order to vary said strength of said magnetic field.

* * * * *